(12) United States Patent
Osanai et al.

(10) Patent No.: US 7,256,353 B2
(45) Date of Patent: Aug. 14, 2007

(54) METAL/CERAMIC BONDING SUBSTRATE AND METHOD FOR PRODUCING SAME

(75) Inventors: Hideyo Osanai, Nagano (JP); Susumu Ibaraki, Nagano (JP); Ken Iyoda, Nagano (JP); Makoto Namioka, Nagano (JP)

(73) Assignee: Dowa Mining Co., Ltd., Tokyo (JP)

( * ) Notice: Subject to any disclaimer, the term of this patent is extended or adjusted under 35 U.S.C. 154(b) by 196 days.

(21) Appl. No.: 10/747,837

(22) Filed: Dec. 29, 2003

(65) Prior Publication Data

US 2004/0144561 A1 Jul. 29, 2004

(30) Foreign Application Priority Data

Dec. 27, 2002 (JP) .......................... P2002-379665

(51) Int. Cl.
*H05K 1/00* (2006.01)
(52) U.S. Cl. .................... 174/252; 174/255; 361/704; 361/720; 361/705; 428/210; 428/545; 428/615; 257/753; 257/706
(58) Field of Classification Search ............... 361/704, 361/707, 719, 720; 174/252, 250, 255–257; 29/830–832, 840, 842, 843; 428/210, 545, 428/615, 627; 257/706, 753; 228/121, 180.21
See application file for complete search history.

(56) References Cited

U.S. PATENT DOCUMENTS

| | | | |
|---|---|---|---|
| 3,199,000 A | 8/1965 | Nippert | |
| 4,700,273 A * | 10/1987 | Kaufman | 361/708 |
| 4,788,765 A | 12/1988 | Kaufman et al. | |
| 4,914,551 A * | 4/1990 | Anschel et al. | 361/714 |
| 5,526,867 A | 6/1996 | Keck et al. | |
| 6,033,787 A * | 3/2000 | Nagase et al. | 428/545 |
| 6,123,895 A * | 9/2000 | Yamagata et al. | 419/13 |
| 6,310,775 B1 * | 10/2001 | Nagatomo et al. | 361/707 |
| 6,426,154 B1 * | 7/2002 | Naba et al. | 428/620 |
| 6,938,333 B2 * | 9/2005 | Osanai et al. | 29/830 |
| 2002/0125563 A1 | 9/2002 | Scheuermann | |
| 2003/0219576 A1 * | 11/2003 | Elmoursi et al. | 428/210 |

FOREIGN PATENT DOCUMENTS

| | | |
|---|---|---|
| EP | 0 523 981 | 1/1993 |
| EP | 1 187 198 | 3/2002 |
| JP | 11000728 | 1/1999 |
| JP | 2002-76551 | 3/2002 |

* cited by examiner

*Primary Examiner*—Dean A. Reichard
*Assistant Examiner*—Hoa C. Nguyen
(74) *Attorney, Agent, or Firm*—Bachman & LaPointe, P.C.

(57) ABSTRACT

There is provided a metal/ceramic bonding substrate capable of preventing the reverse thereof from greatly warping so as to be concave even if it is heated for soldering. In the metal/ceramic bonding substrate, a metal circuit plate 12 is bonded to one side of a ceramic substrate 10, and a heat sink plate (metal base plate) 14 is bonded to the other side thereof. On the heat sink plate 14, a work-hardened layer 16 is formed by shot peening. On the metal circuit plate 12 of the metal/ceramic bonding substrate, semiconductor chips (Si chips) 18 are soldered (solder layer 20). Then, a power module is produced by a predetermined process. On the reverse (the side of the work-hardened layer 16) of the power module, a radiating fin 26 is mounted via a thermal grease 24 by means of screws 22 or the like.

10 Claims, 2 Drawing Sheets

METAL/CERAMIC BONDING SUBSTRATE AND METHOD FOR PRODUCING SAME

BACKGROUND OF THE INVENTION

1. Field of the Invention

The present invention generally relates to a metal/ceramic bonding substrate and a method for producing the same. More specifically, the invention relates to a metal/ceramic bonding substrate for use in super power electronic parts, such as power modules, a method for producing the same, and a power module using the metal/ceramic bonding substrate.

2. Description of the Prior Art

In recent years, power modules are used for controlling heavy-current for electric vehicles, electric railcars and machine tools. In conventional power modules, a ceramic insulating substrate is fixed by soldering to one side of a metal plate or compound material called base plate, and power ICs are fixed by soldering to the ceramic insulating substrate. On the other side (which will be hereinafter referred to as a "reverse") of the base plate, a radiating fin or cooling jacket of a metal is mounted via a thermal conduction grease by means of screws.

Since the soldering of the base plate and power ICs on the ceramic insulating substrate is carried out by heating, the base plate is easy to warp due to the differential coefficient of thermal expansion between bonding members during soldering. Heat generated by the power ICs passes through the ceramic insulating substrate, solder and base plate to be radiated from the radiating fin or cooling jacket to air or cooling water. Therefore, if the base plate warps during soldering, clearance increases when the radiating fin or cooling jacket is mounted on the base plate, so that there is a problem in that the heat sink characteristic of the substrate extremely deteriorates.

The reason for this is as follows. Each of the base plate, radiating fin and cooling jacket is made of a metal, and warps to some extent. Therefore, even if the base plate is caused to contact the radiating fin or cooling jacket, there are non-contact portions therebetween, so that it is not possible to obtain efficient heat conduction. In order to compensate for this, a thermal conduction grease is applied on the base plate and/or the radiating fin or cooling jacket to cause the radiating fin or cooling jacket to tightly contact the base plate. However, the thermal conductivity of the thermal conduction grease is a few W/m which is far smaller than that of other members, such as the base plate. Thus, in order to prevent heat sink characteristic from deteriorating due to the thermal conduction grease, the thermal conduction grease having the minimum thickness of tens to hundreds micrometers necessary to compensate for the fine warpage of the base plate or the like is usually provided between the base plate and the radiating fin or cooling jacket. However, if only the base plate warps by one hundred micrometers, the thickness of that portion of the thermal conduction grease increases by one hundred micrometers, so that heat sink characteristic deteriorates.

In particular, if the reverse of the base plate greatly warps so as to be concave, it is a deathblow, and the thickness of the thermal conduction grease on the central portion of the base plate increases. In order to avoid this, the base plate is usually caused to previously warp by a mechanical operation, and a side of the base plate on which the radiating fin or cooling jacket is to be mounted is caused to warp so as to be flat or convex.

Recently, there has been provided a metal/ceramic circuit board wherein a base plate of aluminum or an aluminum alloy is bonded directly to a ceramic insulating substrate without the need of soldering (see, e.g., Japanese Patent Laid-Open No. 2002-76551).

In the case of the metal/ceramic circuit board disclosed in Japanese Patent Laid-Open No. 2002-76551, it is not required to solder the base plate on the ceramic insulating substrate, so that thermal conductivity is improved therebetween. However, it is required to solder power ICs on the circuit, so that it is required to cause the reverse of the base plate to warp so as to be as flat or convex as possible after heating.

In order to produce the metal/ceramic circuit board disclosed in Japanese Patent Laid-Open No. 2002-76551, molten aluminum is poured onto the ceramic substrate in a shape corresponding to that of the base plate, and solidified to bond an aluminum plate to the ceramic substrate. When such a metal/ceramic circuit board is caused to pass through a furnace in order to solder power ICs, if the base plate and the ceramic substrate contacting therewith are large, the reverse of the base plate tends to be easy to greatly warp so as to be concave. Thus, if the reverse of the base plate greatly warps so as to be concave, there is a problem in that the heat sink characteristic of the board deteriorates due to bad adhesion between the heat sink plate and the radiating fin or cooling jacket.

SUMMARY OF THE INVENTION

It is therefore an object of the present invention to eliminate the aforementioned problems and to provide a metal/ceramic bonding substrate capable of preventing the reverse thereof from greatly warping so as to be concave even if it is heated for soldering, a method for producing the same, and a power module using the metal/ceramic bonding substrate.

In order to accomplish the aforementioned and other objects, the inventors have diligently studied and found that it is possible to prevent the reverse of a metal/ceramic bonding substrate from greatly warping so as to be concave if a work-hardened layer is formed on the reverse of a base plate. Thus, the inventors have made the present invention.

According to one aspect of the present invention, a metal/ceramic bonding substrate comprises: a ceramic substrate; a metal circuit plate bonded to one side of the ceramic substrate; a heat sink member, one side of which is bonded to the other side of the ceramic substrate; and a work-hardened layer formed on the other side of the heat sink member. In this metal/ceramic bonding substrate, the work-hardened layer is preferably formed by work-hardening a surface of the heat sink member by shot peening. The warpage of the other side of the heat sink member is preferably −200 micrometers or more, more preferably in the range of from −100 to +500 micrometers, and most preferably in the range of from 0 to +200 micrometers, assuming that the warpage is a difference in height between a center and edge of the other side of the heat sink member and is positive (+) when the other side of the heat sink member warps so as to be convex and negative (−) when the other side of the heat sink member warps so as to be concave. The metal circuit plate and the heat sink member may contact the ceramic substrate to be bonded directly to the ceramic substrate.

According to another aspect of the present invention, a power module comprises: a metal/ceramic bonding substrate as set forth in claim 1; and a semiconductor chip soldered on the metal circuit plate of the metal/ceramic bonding substrate.

According to a further aspect of the present invention, there is provided a method for producing a metal/ceramic bonding substrate, the method comprising the steps of: bonding a metal circuit plate to one side of a ceramic substrate; bonding one side of a heat sink member to the other side of the ceramic substrate; and forming a work-hardened layer on the other side of the heat sink member. In this method for producing a metal/ceramic bonding substrate, the work-hardened layer is preferably formed by a shot peening method.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a metal/ceramic bonding substrate and a method for producing the same according to the present invention will be described below.

Figure 1:
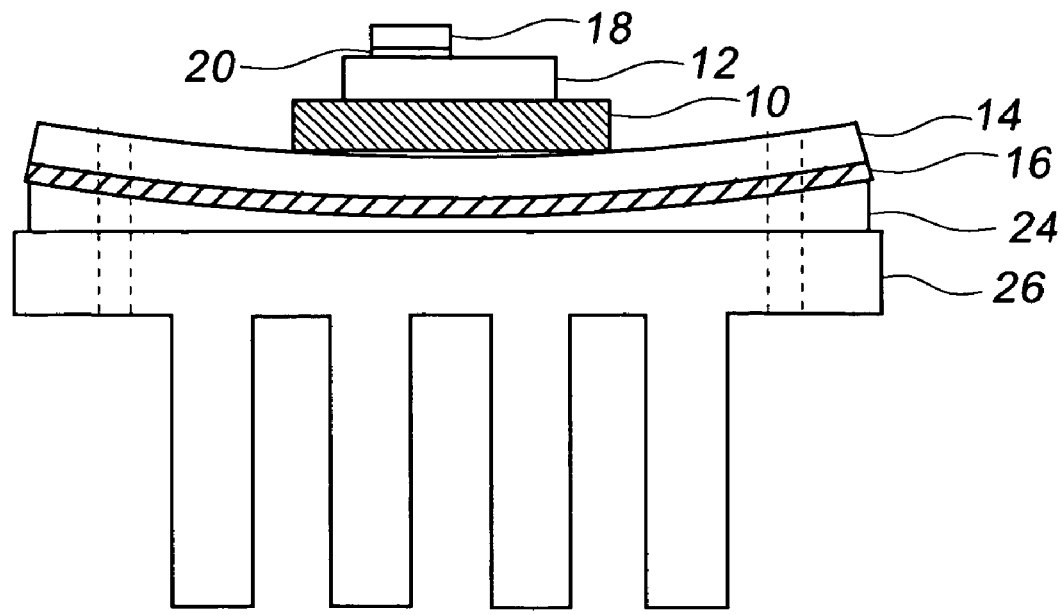
FIG. 1 is a schematic diagram for explaining a step of producing a power module using a preferred embodiment of a metal/ceramic bonding substrate according to the present invention.
Figure 2:
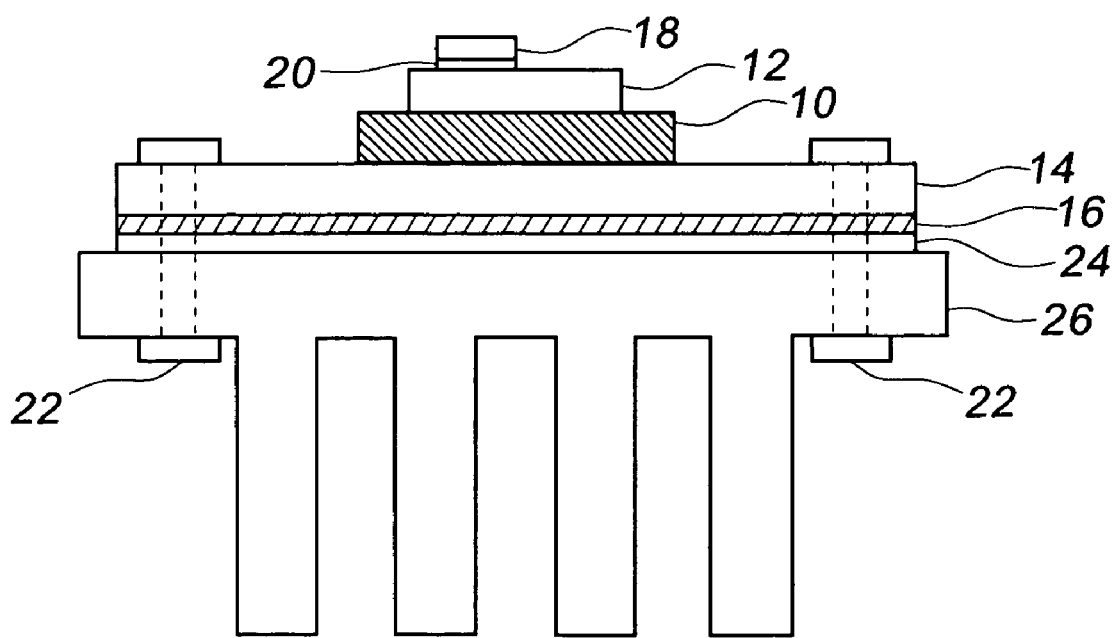
FIG. 2 is a schematic diagram for explaining a step of producing a power module using a preferred embodiment of a metal/ceramic bonding substrate according to the present invention.

FIGS. 1 and 2 are schematic diagrams for explaining a step of producing a power module using a metal/ceramic bonding substrate according to the present invention. As shown in these figures, in a preferred embodiment of a metal/ceramic bonding substrate according to the present invention, a metal circuit plate 12 is bonded to one side of a ceramic substrate 10, and a heat sink plate (metal base plate) 14 is bonded to the other side thereof. On the heat sink plate 14, a work-hardened layer 16 is formed by shot peening. On the metal circuit plate 12 of the metal/ceramic bonding substrate, semiconductor chips (e.g., Si chips) 18 are soldered. In the drawings, reference number 20 denotes a solder layer. Then, a power module (not shown) is produced by steps of: wire-bonding Al wires for wiring between the semiconductor chip 18 and the metal circuit plate 12; bonding a plastic package to the heat sink plate 14 to cover the ceramic substrate 10, metal circuit plate 12 and semiconductor chips 18; and filling an insulating gel in the plastic package. Moreover, a radiating fin 26 is mounted on the reverse (on the side of the work-hardened layer 16) of the power module via a thermal grease 24 by means of screws 22 or the like.

In the preferred embodiment of the metal/ceramic bonding substrate according to the present invention, the work-hardened layer 16 is formed by shot peening in order to simplify working. In general, if ceramic or metal balls are caused to collide with a heat sink plate of a metal, such as aluminum or copper, a surface portion having a thickness of a few to hundreds micrometers is hardened by the peening effect, so that a work-hardened metal layer is formed. It is considered that, if the layer hardened by the peening effect is arranged on the reverse of the heat sink plate, the extending amount of the reverse due to thermal expansion during heating for soldering is greater than the contracting amount of the reverse due to thermal contraction during cooling although the reason for this is not clear, so that the reverse of the heat sink plate can warp so as to be convex after heating. The inventors have studied and found that this warpage can be optionally controlled by the thickness of the peening layer and the degree of work-hardening. Therefore, it was revealed that the work-hardened layer influences the warpage of the reverse of the heat sink plate particularly after heat treatment, such as soldering. The thickness of the peening layer can be controlled by the material, specific gravity and collision speed (blasting pressure) of balls to be caused to collide therewith, and the degree of work-hardening of the peening layer can be controlled by the time to cause the balls to collide therewith.

The materials of the balls to be caused to collide with the heat sink plate includes metals, ceramics, glasses and so forth. since a relatively high pressure is required to obtain the peening effect, ceramic or glass balls having a spherical shape and being difficulty to be deformed are preferable used as balls capable of being repeatedly used under a high pressure. If the heat sink plate is a soft plate, such as an aluminum or copper plate, there is a problem in that balls to be caused to collide therewith stick into the heat sink plate. Therefore, ceramic balls capable of maintaining the spherical shape and having a high strength are preferably used. The ceramic is preferably zirconia being difficult to wear off and having a high strength, although it may be alumina.

The shot peening method may be a method for spraying balls onto the heat sink plate from a nozzle by air pressure in a dry process while moving the nozzle in parallel to the heat sink plate and moving the heat sink plate in a direction perpendicular to the moving direction of the nozzle so as to be capable of continuously and uniformly processing the heat sink plate.

Conventionally, after semiconductor chips, such as Si chips, and so forth are soldered on a metal/ceramic insulating substrate, the reverse of the heat sink plate often greatly warps so as to be concave. In the preferred embodiment of the metal/ceramic bonding substrate according to the present invention, the reverse of the heat sink plate can warp so as to be substantially flat or convex by forming the work-hardened layer on the reverse of the heat sink plate by shot peening. Thus, the heat sink plate can more tightly contact the radiating fin or cooling jacket via the thermal grease.

Figure 3A:
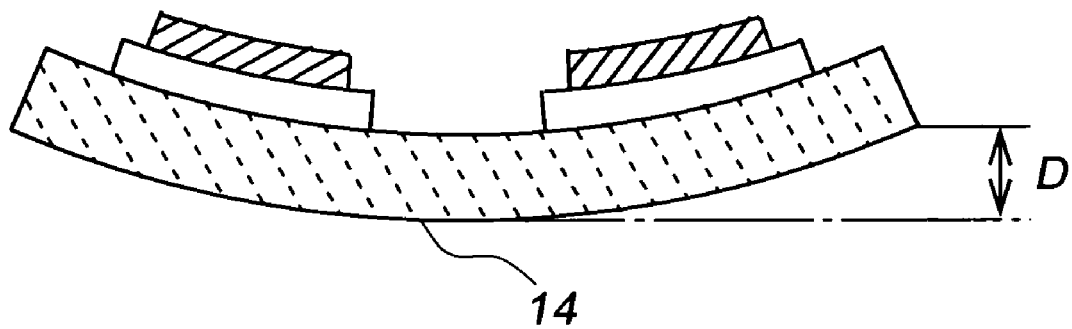
FIGS. 3A and 3B are schematic diagrams for explaining a warpage of a heat sink plate in a preferred embodiment of a metal/ceramic bonding substrate according to the present invention.
Figure 3B:
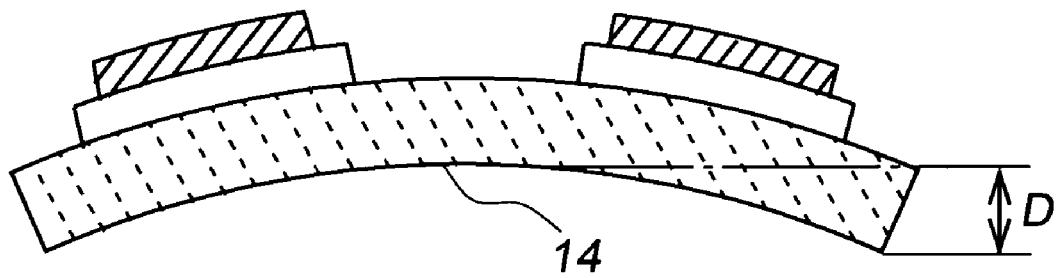

Throughout the specification, the term "warpage" means a difference D in height between the center and edge of the heat sink plate 14 on the side of the radiating fin as shown in FIGS. 3A and 3B, and it is assumed that the warpage is positive (+) when the heat sink plate 14 warps so as to be convex on the side of the radiating fin (in the case of FIG. 3A) and that the warpage is negative (−) when the heat sink plate 14 warps so as to be concave on the side of the radiating fin (in the case of FIG. 3B).

In the preferred embodiment of a metal/ceramic bonding substrate and a method for producing the same according to the present invention, it is possible to prevent the reverse of the metal/ceramic bonding substrate from greatly warping so as to be concave, i.e., to prevent the warpage of the metal/ceramic bonding substrate from being a great negative value, after semiconductor chips and so forth are soldered thereon, so that the warpage can approach a positive value or can be completely a positive value. If the warpage of the metal/ceramic bonding substrate before soldering is such a warpage that semiconductor chips can be put thereon, e.g., a warpage of about ±1 mm, there is no problem. When the radiating fin or cooling jacket is mounted on the heat sink plate via the thermal grease, screws are caused to pass through holes, which are formed in four corners or edges of the heat sink plate and in the radiating fin or the like, to be tightened. Therefore, if the reverse of the heat sink plate has a positive warpage, i.e., if the reverse of the heat sink plate warps so as to be convex, the heat sink plate is deformed so as to be flat by tightening the screws, and the thermal grease becomes familiar, so that the thickness of the thermal grease can be substantially a desired thickness (e.g., 50 to 200 micrometers). Thus, it is possible to obtain good heat sink characteristic. However, if the reverse of the heat sink plate has a large negative warpage, i.e., if the reverse of the heat sink plate greatly warps so as to be concave, the thickness of the thermal grease near the central portion of the metal/ceramic bonding substrate on which the semiconductor chips are mainly mounted increases to greatly the deteriorate heat sink characteristic of the substrate. However, if the reverse of the heat sink plate has a large positive warpage, i.e., if the reverse of the heat sink plate greatly warps so as to be excessively convex, the heat sink plate is greatly deformed during the tightening of the screws, so that there is some possibility that cracks are produced in the ceramic substrate.

Therefore, the warpage of the reverse of the heat sink plate after soldering is preferably −200 micrometers or more, more preferably in the range of from −100 to +500 micrometers, and most preferably in the range of from 0 to +200 micrometers. That is, if the warpage is smaller than −200 micrometers, when the radiating fin or cooling jacket is mounted on the heat sink plate, the thermal conduction grease is too thick, so that it is difficult to ensure the heat sink characteristic of the chips and so forth serving as electronic circuit parts. Therefore, the warpage of the reverse of the heat sink plate is preferably −200 micrometers or more. If the warpage is in the range of from −100 to +500 micrometers, the deformation of the heat sink plate during assembling of the radiating fin or cooling jacket is relatively small, and there is not the possibility that cracks are produced in the ceramic substrate bonded to the heat sink plate. Thus, this range is preferable. Moreover, if the warpage is in the range of from 0 to +200 micrometers, the thickness of the thermal conduction grease during mounting of the radiating fin or cooling jacket on the heat sink plate can be substantially uniform, and the amount of the thermal conduction grease can be decreased, so that it is possible to obtain high heat sink characteristic. For example, it is possible to sufficiently radiate heat from IGBT elements and so forth for use in a power module. In addition, since the deformation of the heat sink plate during assembly is small, it is possible to inhibit cracks from being produced in the ceramic substrate. Moreover, even if various thermal shocks are applied when the substrate is installed in a power module to be used, it is possible to obtain high reliability. Thus, this range is preferable. Therefore, the preferred embodiment of the metal/ceramic bonding substrate according to the present invention can be applied to a power module for automobiles and trains in which high reliability is particularly required.

When the metal circuit plate and the heat sink plate are bonded directly to the ceramic substrate, it is difficult to previously cause the heat sink plate to warp to bond them directly to the ceramic substrate. Therefore, the preferred embodiment of the metal/ceramic bonding substrate according to the present invention is particularly effectively applied to a metal/ceramic bonding substrate wherein a metal circuit plate is bonded directly to a heat sink plate. Moreover, a power module having semiconductor chips soldered on a metal circuit plate in the preferred embodiment of a metal/ceramic bonding substrate according to the present invention has excellent heat sink characteristic and reliability.

Examples of metal/ceramic bonding substrates and methods for producing the same according to the present invention will be described below.

EXAMPLE 1

Two aluminum nitride substrates having a size of 90 mm×80 mm×0.635 mm were arranged in a carbon die at an interval of 10 mm, and molten pure aluminum having a purity of 99.9% (3N) was poured into the die in a furnace at 730° C. in an atmosphere of nitrogen gas while its coat was removed. The die has a groove having such a shape that a metal base plate having a size of 220 mm×90 mm×5 mm is formed on one side of each of the aluminum nitride substrates and that a metal circuit plate having a size of 89 mm×79 mm×0.4 mm is formed on the other side thereof. After the molten aluminum was poured into the die, the die was cooled to a room temperature to solidify aluminum to produce a bonding article having aluminum plates bonded to the ceramic substrates.

Then, a resist mask having a predetermined shape was printed on the metal circuit plate of the aluminum/ceramic bonding article to be dried to be etched with an iron chloride solution to form a circuit pattern. Moreover, $ZrO_2$ spherical balls having a size of 60 meshes or less were uniformly sprayed onto the metal base plate on the reverse of the aluminum/ceramic bonding article, at a pressure of 4 kg/cm² for three minutes by means of a shot blasting system to carry out a peening process.

Thereafter, an Ni—P plating having a thickness of about 4 micrometers was applied on only the circuit pattern side, and eight sets of power ICs having the same size were put thereon via an eutectic soldering plate having a size of 10 mm×10 mm×0.1 mm to be heated at a peak temperature of 380° C. for ten minutes in an atmosphere of N:H=4:1 by volume so as to be heated for one hour in total to solder the power ICs.

After soldering, the warpage of the reverse of the metal base plate at an ordinary temperature was measured by a contact three-coordinate measuring machine. The measured warpage was about 100 micrometers, and the reverse of the metal base plate warped so as to be convex.

Moreover, a power module was produced by processes for connecting terminals of the power ICs and metal circuit plates by wire bonding of Al wires, bonding a plastic case to the heat sink plate, and sealing the case with an insulating gel. A radiating fin was mounted on the power module by means of screws. Thus, there was no problem on the heat sink characteristic of the semiconductor chips, so that good results were obtained.

COMPARATIVE EXAMPLE

Two aluminum nitride substrates having a size of 90 mm×80 mm×0.635 mm were arranged in a carbon die at an interval of 10 mm, and molten pure aluminum having a purity of 99.9% (3N) was poured into the die in a furnace at 730° C. in an atmosphere of nitrogen gas while its coat was removed. The die has a groove having such a shape that a metal base plate having a size of 220 mm×90 mm×5 mm is formed on one side of each of the aluminum nitride substrates and that a metal circuit plate having a size of 89 mm×79 mm×0.4 mm is formed on the other side thereof. After the molten aluminum was poured into the die, the die was cooled to a room temperature to solidify aluminum to produce a bonding article having aluminum plates bonded to the ceramic substrates.

Then, a resist mask having a predetermined shape was printed on the metal circuit plate of the aluminum/ceramic bonding article to be dried to be etched with an iron chloride solution to form a circuit pattern.

Thereafter, an Ni—P plating having a thickness of about 4 micrometers was applied on only the circuit pattern side, and eight sets of power ICs having the same size were put thereon via an eutectic soldering plate having a size of 10 mm×10 mm×0.1 mm to be heated at a peak temperature of 380° C. for ten minutes in an atmosphere of N:H=4:1 by volume so as to be heated for one hour in total to solder the power ICs.

After soldering, the warpage of the reverse of the metal base plate at an ordinary temperature was measured by a contact three-coordinate measuring machine. The measured warpage was about 500 micrometers, and the reverse of the metal base plate warped so as to be concave.

Moreover, a power module was produced by the same processes as those in Example 1, and a radiating fin was mounted on the power module by means of screws. Thus, the heat sink characteristic of the semiconductor chips was bad, and malfunction occurred.

EXAMPLES 2 THROUGH 8

Aluminum/ceramic bonding articles were produced by the same method as that of Example 1, except that $ZrO_2$ spherical balls having a size of 60 meshes or less were uniformly sprayed onto the metal base plate at a pressure of 4 kg/cm$^2$ for five minutes (Example 2), at a pressure of 4 kg/cm$^2$ for one minute (Example 3), at a pressure of 5 kg/cm$^2$ for one minute (Example 4), at a pressure of 5 kg/cm$^2$ for three minutes (Example 5), at a pressure of 5 kg/cm$^2$ for five minutes (Example 6), at a pressure of 3 kg/cm$^2$ for one minute (Example 7) and at a pressure of 3 kg/cm$^2$ for three minutes (Example 8), respectively, to carry out the peening process. The warpages of the reverse of the metal base plates at an ordinary temperature were measured by the same method as that in Example 1. As a result, the measured warpages were +200 micrometers (Example 2), −50 micrometers (Example 3), +1000 micrometers (Example 4), +1500 micrometers (Example 5), +3000 micrometers (Example 6), −100 micrometers (Example 7) and −100 micrometers (Example 8), respectively.

In Examples 1 and 2, when the radiating fin was screwed, the thickness of the thermal conduction grease was uniformly about 50 micrometers, and heat sink characteristic was very good, so that it was found that it was possible to sufficiently radiate heat of power elements. In Examples 3, 7 and 8, when the radiating fin was screwed, the thickness of the thermal conduction grease was uniform. However, the thickness of the thick portion of the thermal conduction grease was about 100 to 150 micrometers, and there was no problem on heat sink characteristic for power modules, so that sufficiently good characteristics were obtained. In Examples 4, 5 and 6, when the radiating fin was screwed, the thickness of the thermal conduction grease was about 150 micrometers, and there was no problem on heat sink characteristic for power modules, so that sufficiently good characteristics were obtained. However, in Examples 4 through 6, since the warpage was relatively large when the radiating fin was screwed, it was required to slowly tighten the screws so that no cracks were produced in the ceramic substrate. On the other hand, in Comparative Example, when the radiating fin was screwed, the thickness of the thermal conduction grease was uniform, and the thickness of the thick portion thereof was about 550 micrometers, so that it was not possible to obtain heat sink characteristic necessary for power modules as described above.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic bonding substrate comprising:
    a ceramic substrate;
    a metal circuit plate bonded to one side of said ceramic substrate; and
    a heat sink plate of a metal, one surface of the heat sink plate being bonded to the other side of said ceramic substrate, and another surface of the heat sink plate comprising a work-hardened surface of said metal of said heat sink plate for mounting thereon a radiating or cooling means.

2. A metal/ceramic bonding substrate as set forth in claim 1, wherein said work-hardened layer is formed by shot peening.

3. A metal/ceramic bonding substrate as set forth in claim 1, wherein a warpage of the another surface of said heat sink plate is −200 micrometers or more, assuming that said warpage is a difference in height between a center and edge of the another surface of said heat sink plate and is positive (+) when the other side of said heat sink plate warps so as to be convex and negative (−) when the another surface of said heat sink plate warps so as to be concave.

4. A metal/ceramic bonding substrate as set forth in claim 1, wherein a warpage of the another surface of said heat sink plate is in the range of from −100 to +500 micrometers, assuming that said warpage is a difference in height between a center and edge of the another surface of said heat sink plate and is positive (+) when the another surface of said heat sink plate warps so as to be convex and negative (−) when the another surface of said heat sink plate warps so as to be concave.

5. A metal/ceramic bonding substrate as set forth in claim 1, wherein a warpage of the another surface of said heat sink plate is in the range of from 0 to +200 micrometers, assuming that said warpage is a difference in height between a center and edge of the another surface of said heat sink plate and is positive (+) when the another surface of said heat sink plate warps so as to be convex and negative (−) when the another surface of said heat sink plate warps so as to be concave.

6. A metal/ceramic bonding substrate as set forth in claim 1, wherein said metal circuit plate and said heat sink plate contact said ceramic substrate to be bonded directly to said ceramic substrate.

7. A metal/ceramic bonding substrate as set forth in claim 6, wherein said metal is aluminum or an aluminum alloy.

8. A power module comprising:
a metal/ceramic bonding substrate as set forth in claim 1; and
a semiconductor chip soldered on said metal circuit plate of said metal/ceramic bonding substrate.

9. A metal/ceramic bonding substrate as set forth in claim 1, wherein said metal is aluminum or an aluminum alloy.

10. A metal/ceramic bonding substrate as set forth in claim 1, wherein said metal is copper.

* * * * *